(12) United States Patent
Liu et al.

(10) Patent No.: US 11,265,108 B2
(45) Date of Patent: Mar. 1, 2022

(54) METHOD AND DEVICE FOR RATE MATCHING AND POLAR ENCODING

(71) Applicant: HUAWEI TECHNOLOGIES CO., LTD., Guangdong (CN)

(72) Inventors: Rongke Liu, Beijing (CN); Baoping Feng, Beijing (CN); Guijie Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/910,505

(22) Filed: Jun. 24, 2020

(65) Prior Publication Data

US 2020/0322090 A1  Oct. 8, 2020
US 2021/0266099 A9  Aug. 26, 2021

Related U.S. Application Data

(63) Continuation of application No. PCT/CN2018/120502, filed on Dec. 12, 2018.

(30) Foreign Application Priority Data

Dec. 26, 2017   (CN) .......................... 201711437275.1

(51) Int. Cl.
*H04L 1/00* (2006.01)
*H03M 13/00* (2006.01)

(52) U.S. Cl.
CPC ........ *H04L 1/0068* (2013.01); *H03M 13/618* (2013.01); *H03M 13/6362* (2013.01);
(Continued)

(58) Field of Classification Search
CPC ... H04L 1/0041; H04L 1/0013; H04L 1/0057; H04L 1/0068; H04L 1/0042;
(Continued)

(56) References Cited

U.S. PATENT DOCUMENTS 10,128,982 B2   11/2018  Huang et al.
2015/0077277 A1   3/2015  Alhussien et al.
(Continued)

FOREIGN PATENT DOCUMENTS

CN    107040261 A    8/2017
CN    107342774 A    11/2017
(Continued)

OTHER PUBLICATIONS

K. Niu, K. Chen, and J. R. Lin, "Beyond turbo codes: rate-compatible punctured polar codes", in Proc. IEEE International Conference on Communications, pp. 3423-3427, 2013, total 5 pages.
(Continued)

*Primary Examiner* — Shelly A Chase

(57) ABSTRACT

The present disclosure provides an encoding method and apparatus, and relates to the field of communications technologies, to reduce an encoding latency and complexity, and the amount of computation of real-time construction. The encoding method includes: obtaining information bits; determining a puncturing pattern, where the puncturing pattern includes an element in a puncturing set and an element in a shortening set, and the puncturing set and the shortening set have no intersection set; and performing, by using the determined puncturing pattern, rate matching on data obtained after the information bits are encoded.

20 Claims, 8 Drawing Sheets

(52) U.S. Cl.
CPC .......... *H04L 1/0013* (2013.01); *H04L 1/0041* (2013.01); *H04L 1/0057* (2013.01)

(58) Field of Classification Search
CPC ... H04L 1/0009; H03M 13/13; H03M 13/618; H03M 13/6362; H03M 13/6306
See application file for complete search history.

(56) References Cited

U.S. PATENT DOCUMENTS

| | | | |
|---|---|---|---|
| 2016/0308644 A1 | 10/2016 | Shen et al. | |
| 2017/0012740 A1* | 1/2017 | Shen | H03M 13/6306 |
| 2017/0222757 A1 | 8/2017 | Huang et al. | |
| 2017/0331590 A1* | 11/2017 | Wu | H04L 1/1819 |
| 2019/0149176 A1* | 5/2019 | Hui | H03M 13/13 714/790 |
| 2019/0149370 A1* | 5/2019 | Lee | H04L 1/0042 370/210 |
| 2019/0181983 A1* | 6/2019 | Ye | H04L 1/0009 |
| 2020/0321986 A1* | 10/2020 | Hui | H03M 13/6362 |

FOREIGN PATENT DOCUMENTS

| | | |
|---|---|---|
| CN | 107395319 A | 11/2017 |
| CN | 107395324 A | 11/2017 |
| CN | 105493424 B | 2/2019 |
| WO | 2017176309 A1 | 10/2017 |
| WO | 2017194133 A1 | 11/2017 |

OTHER PUBLICATIONS

D. M. Shin, S.-C. Lim, and K. Yang, "Design of length-compatible polar codes based on the reduction of polarizing matrices", IEEE Trans. Commun., vol. 61, No. 7, pp. 2593-2599, Jul. 2013, total 7 pages.

L. Zhang, Z. Y. Zhang, et. al., "On the puncturing patterns for punctured polar codes", in Proc. IEEE Int. Symp. Inform. Theory (ISIT), pp. 121-125, 2014, total 5 pages.

Niu K, Dai J, Chen K, et al. "Rate-Compatible Punctured Polar Codes: Optimal Construction Based on Polar Spectra", Dec. 5, 2016, [Online]. Available: http://arxiv.org/pdf/1612.01352.pdf, total 14 pages.

R. Wang and R. Liu, "A novel puncturing scheme for polar codes", IEEE Commun. Lett., vol. 18, No. 12, pp. 2081-2084, Dec. 12, 2014, total 4 pages.

V. Miloslavskaya, "Shortened polar codes", IEEE Trans. Inf. Theory, vol. 61, No. 9, pp. 4852-4865, Sep. 2015, total 14 pages.

Mori R., Tanaka T., "Performance of polar codes with the construction using density evolution", IEEE Communications Letters, 13(7), Jul. 2009: 519-521, total 3 pages.

Chung S. Y., Richardson T. J., and Urbanke R. L., "Analysis of sum product decoding of low density parity-check codes using a Gaussian approximation", IEEE Transactions on Information Theory, vol. 47, No. 2, Feb. 2001: 657-670, total 14 pages.

Tai I., and Vardy A., "How to construct polar codes", IEEE Trans. on Information Theory, 59(10), Oct. 2013: 6562-6582, total 21 pages.

Valerio Bioglio, Frederic Gabry, Ingmar Land, "Low-Complexity Puncturing and Shortening of Polar Codes", Jan. 23, 2017 WCNC, total 6 pages.

Huawei et al., "Details of the Polar code design", 3GPP TSG RAN WG1 Meeting #87, R1-1611254, Reno, USA, Nov. 10-14, 2016, total 15 pages.

Zte et al., "Rate Matching of Polar Codes for eMBB", 3GPP TSG RAN WG1 Meeting #88, R1-1701602, Athens, Greece Feb. 13-17, 2017, total 20 pages.

Huawei et al.,"Polar code design and rate matching", 3GPP TSG RAN WG1 Meeting #86, R1-167209, Gothenburg, Sweden, Aug. 22-26, 2016, total 5 pages.

Office Action dated Feb. 2, 2021, issued in CN Application No. 201711437275.1, total 5 pages.

* cited by examiner

METHOD AND DEVICE FOR RATE MATCHING AND POLAR ENCODING

CROSS-REFERENCE TO RELATED APPLICATIONS

This application is a continuation of International Application No. PCT/CN2018/120502, filed on Dec. 12, 2018, which claims priority to Chinese Patent Application No. 201711437275.1, filed on Dec. 26, 2017. The disclosures of the aforementioned applications are hereby incorporated by reference in their entireties.

TECHNICAL FIELD

The present disclosure relates to the field of encoding and decoding technologies, and in particular, to a method and device for rate matching and encoding of a polar code.

BACKGROUND

A mobile internet service and an internet of things service will become main forces driving mobile communication developments in 2020 and the future. A 5th generation (5G) mobile network or 5th generation wireless system (5G) meets people's diversified service requirements in fields such as home, workplace, entertainment, and transport, and can also provide users with ultimate service experience in, for example, ultra-high-definition videos, virtual reality, cloud desktops, and online games even in scenarios with ultra-high traffic density, ultra-high connection density, and ultra-high mobility features, such as densely populated residential areas, offices, stadiums, outdoor gatherings, subways, expressways, high-speed railways, and wide coverage areas. Therefore, compared with a conventional network such as 4G long term evolution (LTE), a 5G network needs to provide wider bandwidth, more connections, and a lower latency.

A polar code is a new type of code for channel coding proposed by E. Arikan in 2009. The polar code is designed based on channel polarization, and is the first constructive coding scheme that can be proved by using a strict mathematical method to achieve the capacity of a channel. However, the polar code is constructed by using a Kronecker power. This construction manner limits a code length of the polar code, and it is inconvenient to use the polar code in an actual system. In other words, only a polar code with code length $2^n$ (n=1, 2, . . . ) can be constructed by using the original Kronecker method. Although a polar code with another code length may be constructed by using another polar core such as a Bose, Ray-Chaudhuri and Hocquenghem (BCH) code core. However, a code length of the polar code constructed by using BCH is still limited to a power of a core length, and a decoding structure of the polar code constructed by using BCH is relatively complex.

To implement a polar coding scheme with a variable-code-length rate matching, current rate matching for the polar code mainly includes two schemes: puncturing polar codes and shortening polar codes. The puncturing polar codes are that bits at some locations are selected on an encoder side and not transmitted, prior information of the bits that are not transmitted at these locations is set to 0 or 1 (with an equal probability) on a decoder side. In other words, a log-likelihood ratio (LLR) value is set to 0. The shortening polar codes are that some input bits are set to known values on an encoder side, and values of bits at locations at which codewords are not transmitted correspond to these known bits, to ensure that a decoder side knows the values of the bits that are not transmitted at these locations. In this way, LLR values at these locations are set to relatively large values, and puncturing or shortening is to be performed during rate matching.

In addition, a location of a frozen set needs to be determined in a polar encoding process, and the frozen set is selected and determined based on an error probability of a subchannel. A subchannel with a high channel error probability is considered to be in a poor channel condition, and an error easily occurs when information is transmitted through this channel Therefore, bits transmitted through these channels are set to known values, and locations at which these bits are located are set as the frozen set. Currently, on an additive white Gaussian noise (AWGN) channel, schemes used for calculating an error probability of a subchannel mainly include density evolution (DE) and Gaussian approximation (GA). A density evolution algorithm can be used to calculate channel polarization reliability of channel polarization of an arbitrary binary-input symmetric channel. However, the density evolution algorithm has very high calculation complexity. A Gaussian approximation algorithm is a simplified algorithm of the density evolution algorithm. However, the amount of computation in a real-time Gaussian approximation construction is quite large.

A polar code is constructed based on channel polarization and is affected by a channel condition. When a channel changes or a construction condition changes, relatively good decoding performance of the polar code can be ensured only when the polar code is reconstructed based on a new channel or construction condition. However, in some low-latency application scenarios, if a channel condition changes frequently or code length switching is performed frequently, the amount of computation in real-time density evolution construction and real-time Gaussian approximation construction are quite large. Consequently, the requirement of a low-latency system cannot be met. Based on the foregoing disadvantages, a construction solution in which polar code construction is independent of a channel, namely, Polarization Weight (PW) construction, is studied. In this construction solution, a frozen set does not need to be reselected based on a change of a channel, thereby resolving a problem that the frozen set needs to be calculated in real time. Therefore, the real-time requirement of a system can be met. However, because polar code construction depends on a channel, in some cases, the frozen set selected by using the PW construction may not match the channel well. Consequently, decoding performance of successive cancellation (SC) is inferior to the performance of the DE or the GA. This is not a best choice for a highly reliable non-real-time service.

Application scenarios vary with different polar code construction, and frozen sets are also different based on different polar code construction. Consequently, different rate matching algorithms are used. The different rate matching algorithms are related to the polar code construction, and the different rate matching algorithms have relatively great differences in requirements for a system and real-time performance. In a polar code puncturing scheme based on a rate of polarization, rates of polarization corresponding to all generated matrices with code lengths less than 16 are traversed, to select a puncturing pattern corresponding to a maximum rate of polarization of a generated matrix corresponding to each code length, and select a frozen set based on the Gaussian approximation after the puncturing pattern is obtained, so as to complete polarization encoding. In an encoding process of this method, it takes time to construct the puncturing pattern in a nested manner, and storage space is required to store the puncturing pattern corresponding to each of the code lengths less than 16.

In a quasi-uniform shortening scheme, a puncturing pattern is determined through bits reversal and reordering. The quasi-uniform shortening scheme is easy to implement, and reduces required storage space. However, these solutions are all based on the density evolution construction or the Gaussian approximation construction. Therefore, for a low-latency system, the amount of computation in the real-time construction is very large, and a low-latency requirement cannot be met.

SUMMARY

Embodiments of the present invention provide a polar encoding method and an apparatus, to resolve a conventional polar code encoding problem in the art that the requirements of low-latency and low-complexity cannot be met, and computation complexity in real-time construction is very high.

To achieve the foregoing objectives, the following technical solutions are used in the embodiments of the present invention.

According to a first aspect, a rate matching method is provided, where the method is applied to a terminal or a network encoding device, and the method includes: obtaining information bits; determining a puncturing pattern, where the puncturing pattern includes an element in a puncturing set and an element in a shortening set, and the puncturing set and the shortening set have no intersection set; and performing, by using the puncturing pattern, rate matching on data obtained after the information bits are encoded. In the foregoing implementation, the puncturing pattern is easy to be selected and implemented, and the requirements of low-latency and low-complexity can be met. When a code rate in encoding changes, a puncturing pattern can be quickly generated, and therefore a performance requirement can be met.

In a possible implementation of the first aspect, the puncturing pattern includes |P|=N−M elements, where $N=2^{\lceil log_2 M \rceil}$ is a mother code length, and M is a code length.

In a possible implementation of the first aspect, when R>½, a quantity of elements in the shortening set $|P2|=\lfloor |P| \times R1 \rfloor$, and a quantity of elements in the puncturing set |P1|=|P|−|P2|, where R1 is ¾ or R; or when R<⅓ and an information bits length K is less than or equal to 64, or when R is equal to ⅓ and the code length M is not greater than 128, a quantity of elements in the puncturing set |P1|=|P|, and a quantity of elements in the shortening set |P2|=0; or when ⅓<R≤½, or when R<⅓ and an information bits length K is greater than 64, or when R=⅓ and the code length M is greater than 128, a quantity of elements in the shortening set $|P2|=\lfloor |P| \times R2 \rfloor$, and a quantity of elements in the puncturing set |P1|=|P|−|P2|, where R2 is ⅔ or ½; and R is a code rate. In the foregoing implementation, the puncturing pattern, the quantity of elements in each of the puncturing set and the shortening set may be determined based on information about the code rate and the code length. This simplifies the amount of computation.

In a possible implementation of the first aspect, an element in the shortening set is selected from an initial sequence v1 with length N, and elements in the puncturing set are selected from a bits reversal sequence v2 with length N; and the initial sequence v1 with length N is {0, 1, 2, . . . , N−1}, and the bits reversal sequence v2 is a sequence obtained by performing bits reversal on a binary form of each element in the initial sequence v1. In the foregoing possible implementation, the elements in each of the puncturing set and the shortening set are selected by using the sequence, so that an operation is simple, the amount of computation is small, and complexity is low. In this way, the puncturing pattern can be quickly determined.

In a possible implementation of the first aspect, the puncturing set includes leading |P1| elements in the reversal sequence v2; and the shortening set includes last |P2| elements in the initial sequence v1. In the foregoing possible implementations, it is simple to select the elements in each of the puncturing set and the shortening set, complexity is low, and a low-latency requirement can be met.

In a possible implementation of the first aspect, if the code rate R is equal to ⅓, the information bits length K is less than 64, the code length M is greater than 128, an intersection set of leading |P1| elements in the reversal sequence v2 and last |P2| elements in the initial sequence v1 is not an empty set, and a quantity of elements in the intersection set is |P1∩P2|, the puncturing set includes a first element set and a third element, the first element set includes an element in the leading |P1| elements in the reversal sequence v2 other than |P1∩P2| elements, the third element set includes leading $C_p$ elements in the reversal sequence v2 other than the first element set, and the |P1∩P2| elements include an element in the intersection set of the leading |P1| elements in the reversal sequence v2 and the last |P2| elements in the initial sequence v1; and the shortening set includes a second element set and a fourth element set, the second element set includes an element in the last |P2| elements in the initial sequence v1 other than the |P1∩P2| elements, and the fourth element set includes last $C_s$ elements in the initial sequence v1 other than the second element set and the third element set; or if the following conditions are not met: the code rate R is equal to ⅓, the information bits length K is less than 64, and the code length M is greater than 128, the puncturing set includes leading |P1| elements in the reversal sequence v2, and the shortening set includes last |P2| elements in the initial sequence v1 other than the elements in the puncturing set. In the foregoing possible implementation, the puncturing set and the shortening set are formed by selecting set elements, so that the method is simple, complexity is low, and the amount of computation is small.

According to a second aspect, a polar encoding method is provided, where the method is applied to a terminal or a network encoding device, and the method includes: obtaining information bits; determining a frozen set, where the frozen set includes a first frozen subset, a second frozen subset, and a third frozen subset, and the third frozen subset is determined based on the first frozen subset and the second frozen subset; and performing polar encoding on the information bits by using the frozen set. In the foregoing implementation, the frozen set can be quickly generated, to meet a low-latency and low-complexity application scenario. Polar code encoding is performed based on simulation performance by using the frozen set in this embodiment, so that complexity is greatly reduced, and the requirement of a low-latency service can be met.

In a possible implementation of the second aspect, when R>½, a quantity of elements in the second frozen subset $|F2|=\lfloor |P| \times R1 \rfloor$, and a quantity of elements in the first frozen subset |F1|=|P|−|P2|, where R1 is ¾ or R, |P|=N−M, $N=2^{\lceil log_2 M \rceil}$ is a mother code length, and M is a code length; or when R<⅓ and an information bits length K is less than or equal to 64, or when R is equal to ⅓ and the code length M is not greater than 128, a quantity of elements in the first frozen subset |F1|=|P|, and a quantity of elements in the second frozen subset |F2|=0; or when ⅓<R≤½, or when R<⅓ and the information bits length K is greater than 64, or when R=⅓ and the code length M is greater than 128, a quantity of elements in the second frozen subset |F2|=⌊|P|× R2⌋, and a quantity of elements in the first frozen subset |F1|=|P|−|F2|, where R2 is ⅔ or ½; and R is a code rate. In the foregoing possible implementation, the quantity of elements in each of the first frozen subset and the second frozen subset is determined by using the code rate and the code length, so that the method is simple, complexity is low, and the amount of computation is small.

In a possible implementation of the second aspect, the first frozen subset includes leading |F1| elements in an initial sequence v1 with length N, and the second frozen subset includes last |F2| elements in a bits reversal sequence v2 with length N; and the initial sequence v1 with length N is {0, 1, 2, . . . , N−1}, and the bits reversal sequence v2 is a sequence obtained by performing bits reversal on a binary form of each element in the initial sequence v1. In the foregoing possible implementation, obtaining the first frozen subset and the second frozen subset by using the sequence is easy to implement and operate.

In a possible implementation of the second aspect, the third frozen subset includes M−K elements with lowest reliability in the initial sequence other than the elements in the first frozen subset and the elements in the second frozen subset, where K is the information bits length. In the foregoing possible implementation, the elements in the third frozen subset can be quickly obtained, so that implementation is simple and complexity is low.

In a possible implementation of the second aspect, the method further includes: determining a puncturing pattern, where the puncturing pattern includes a puncturing set and a shortening set, and the puncturing set and the shortening set have no intersection set; and performing rate matching on the encoded information bits by using the puncturing pattern. In the foregoing possible implementation, both the puncturing pattern and the frozen set may be determined, both a low-latency requirement and a low-complexity requirement are met, and the amount of computation in real-time construction is very low. In addition, simulation display still maintains very good performance when a channel and a code length frequently change.

In a possible implementation of the second aspect, a quantity of elements in the shortening set is the same as the quantity of elements in the second frozen set, and a quantity of elements in the puncturing set is the same as the quantity of elements in the first frozen subset. In the foregoing possible implementation, the amount of computation is simplified, and a latency is further reduced.

According to another aspect of this application, a device for encoding is provided. The device is used to implement a function in the rate matching method according to any one of the first aspect or the possible implementations of the first aspect. The function may be implemented by hardware, or may be implemented by hardware by executing corresponding software. The hardware or the software includes one or more units corresponding to the foregoing function.

In a possible implementation, a structure of the device for encoding includes a processor and a memory. The memory stores code and data. The processor is configured to support the device in performing the encoding method according to any one of the first aspect or the possible implementations of the first aspect. Optionally, the device may further include a communications interface and a bus. The communications interface is connected to the processor and the memory by using the bus.

According to still another aspect of this application, a computer-readable storage medium is provided. The computer-readable storage medium stores one or more instructions, and when the one or more instructions run on a computer, the computer is enabled to perform the encoding method according to any one of the first aspect or the possible implementations of the first aspect, or perform the encoding method according to any one of the second aspect or the possible implementations of the second aspect.

According to still another aspect of this application, a computer program product including one or more instructions is provided. When the computer program product runs on a computer, the computer is enabled to perform the encoding method according to any one of the first aspect or the possible implementations of the first aspect, or perform the encoding method according to any one of the second aspect or the possible implementations of the second aspect.

It may be understood that the apparatus, the computer storage medium, or the computer program product of any encoding method provided above are used to perform corresponding method described above. Therefore, for a beneficial effect that can be achieved by the apparatus, the computer storage medium, or the computer program product, reference may be made to the beneficial effect in the corresponding method described above.

DESCRIPTION OF EMBODIMENTS

Reference will now be made in detail to embodiments, examples of which are illustrated in the accompanying drawings. In the following detailed descriptions, numerous specific details are set forth in order to provide a thorough understanding of the subject matter presented herein. However, it will be apparent to one skilled in the art that the subject matter may be practiced without these specific details. In other instances, well-known methods, procedures, components, and circuits have not been described in detail so as not to unnecessarily obscure aspects of the embodiments.

The embodiments provided in the present invention are mainly applied to various communications systems supporting polar code encoding, including but not limited to a digital signal processing unit or a baseband processing unit in a communications system, and any functional unit or circuit supporting polar code encoding and decoding. All embodiments of the present invention may be applied to various network devices and terminals. The network device includes but is not limited to an LTE evolved E-UTRAN NodeB (eNB), a next generation NodeB (gNB), a relay node (RN), an access point device, and any network device accessing user equipment (UE). The terminal includes but is not limited to a mobile phone, an intelligent terminal, a tablet computer, a laptop computer, a video game console, a multimedia player, a computer, an access point (connected to a network by using a wireless link), and the like.

In embodiments of this application, a puncturing pattern is a set of locations at which the encoded bits are discarded. On an input side of an encoder, the reliability at some locations (also referred to as subchannels) of bits is lower than a threshold and cannot be used for information bits transmission, and the bits at these locations are set to fixed bits. A set of locations of the fixed bits is called a frozen set. Rate matching means that encoded bits are retransmitted or punctured to match a bearer capability of a physical channel and reach a bit rate required for a transmission format during channel mapping. In embodiments of this application, rate matching is mainly implemented by using a puncturing pattern.

Figure 1:
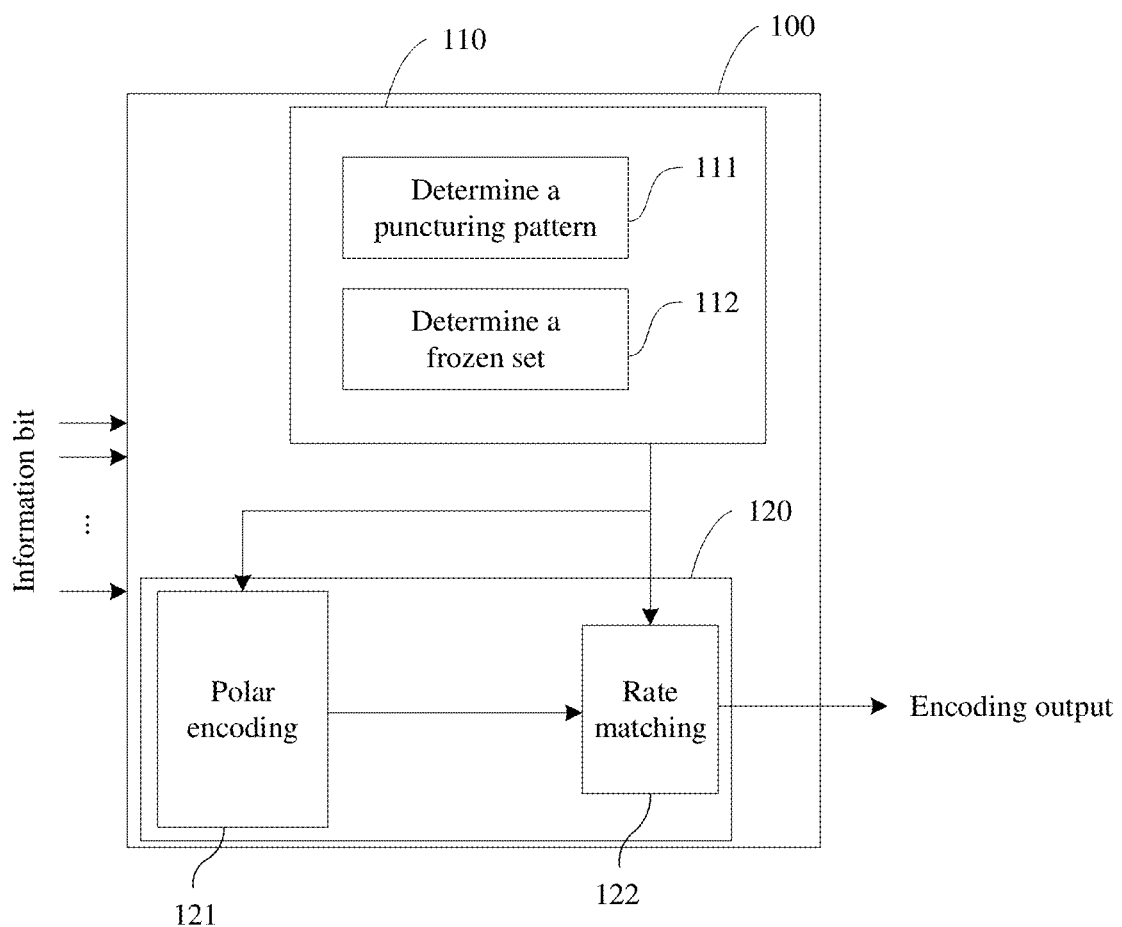
FIG. 1 is a schematic diagram of a polar encoding process according to an embodiment of the present disclosure.

FIG. 1 is a schematic diagram of a polar encoding process according to an embodiment of this application. The polar encoding process 100 shown in FIG. 1 mainly includes an encoding information generation process 110 and an encoding process 120. The encoding information generation process 110 includes determining a puncturing pattern 111 and/or determining a frozen set 112. Correspondingly, the encoding process 120 includes performing polar encoding 121 and/or performing rate matching 122. The puncturing pattern and the frozen set generated in the encoding information generation process 110 are used in the encoding process 120. The frozen set is used for selecting information bits in the polar encoding 121, and the puncturing pattern is used for performing rate matching in the rate matching 122.

Specifically, in the encoding information generation process 110, the puncturing pattern is generated in the process of determining a puncturing pattern 111. The puncturing pattern includes a union set of a puncturing set and a shortening set, and the puncturing set and the shortening set have no intersection set. The puncturing set is a set of locations at which the encoded bits that generated by using a puncturing algorithm are discarded, and the shortening set is a set of locations at which encoded bits that generated by using a shortening algorithm are discarded. It should be understood that the puncturing algorithm and the shortening algorithm are merely examples, and any other improved algorithm or replacement algorithm similar to the puncturing algorithm or the shortening algorithm also falls within the protection scope of the present invention. In the encoding information generation process 110, the frozen set is generated in the process of determining a frozen set 112. The frozen set includes a union set of a first frozen subset, a second frozen subset, and a third frozen subset, and the third frozen subset is determined based on the first frozen subset and the second frozen subset.

The puncturing pattern and the frozen set may be independently generated, or may be generated together. This is not limited in embodiments of the present disclosure.

After the puncturing pattern and the frozen set are obtained, polar coding is performed in the polar encoding 121 by using the frozen set, and rate matching is performed in the rate matching 122 by using the puncturing pattern.

The solution in this embodiment is a polar coding scheme that can meet both a low-latency requirement and a low-complexity requirement, and a polar coding scheme that achieves good performance when a channel and a code length frequently change.

Figure 2:
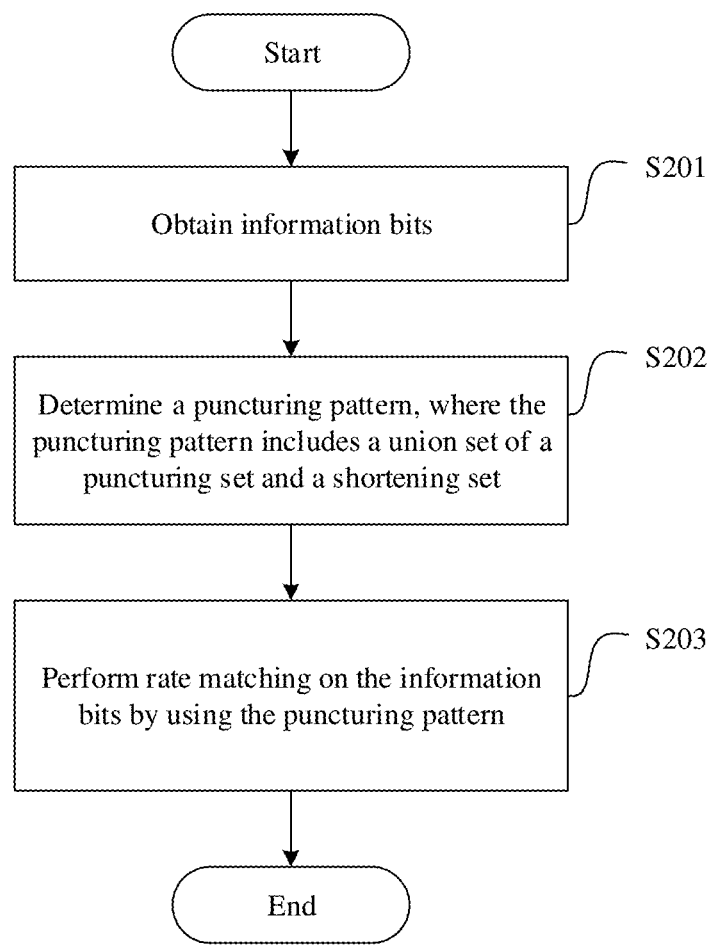
FIG. 2 shows a puncturing pattern generation process according to an embodiment of the present disclosure.

FIG. 2 shows a puncturing pattern generation process according to an embodiment of this application. Referring to FIG. 2, the process describes a puncturing pattern generation method in FIG. 1 in detail, and includes the following steps.

S201: Obtain information bits.

The information bits are usually a bit string including user data or processed user data.

S202: Determine a puncturing pattern, where the puncturing pattern includes a union set of a puncturing set and a shortening set, and the puncturing set and the shortening set have no intersection set.

In this embodiment, a puncturing algorithm and a shortening algorithm are jointly used to generate the puncturing pattern, where the puncturing algorithm is used to generate the puncturing set, and the shortening algorithm is used to generate the shortening set. It should be understood that the puncturing algorithm and the shortening algorithm are merely examples, and any other improved algorithm or replacement algorithm similar to the puncturing algorithm or the shortening algorithm also falls within the protection scope of the present invention. In this embodiment, the puncturing algorithm and the shortening algorithm are merely used as an example but not limitation.

Optionally, the puncturing pattern includes $|P|=N-M$ elements, where $N=2^{\lceil log_2 M \rceil}$ is a mother code length, M is a code length, a symbol $\lceil\ \rceil$ represents rounding up, a symbol $\|\ \|$ represents a quantity of elements in a set, and $|P|$, N, and M are all positive integers.

Optionally, a quantity of elements in the puncturing set P1 is $|P1|$ (which is a positive integer), and a quantity of elements in the shortening set P2 is $|P2|$ (which is a positive integer). The quantity of elements in the two sets and the quantity $|P|$ of elements of the puncturing pattern are determined based on the following:

When $R>\frac{1}{2}$, $|P2|=\lceil |P|\times R1 \rceil$ and $|P1|=|P|-|P2|$, where a symbol $\lfloor\ \rfloor$ represents rounding down, and R is a code rate, where R1 is $\frac{3}{4}$ or R.

Alternatively, when $R<\frac{1}{3}$ and an information bits length K is less than or equal to 64, or when R is equal to $\frac{1}{3}$ and the code length M is not greater than 128, the quantity of elements in the puncturing set $|P1|=|P|$, and the quantity of elements in the shortening set $|P2|=0$.

Alternatively, when $\frac{1}{3}<R\leq\frac{1}{2}$, or when $R<\frac{1}{3}$ and an information bits length K is greater than 64, or when $R=\frac{1}{3}$ and the code length M is greater than 128, the quantity of elements in the shortening set $|P2|=\lfloor |P|\times R2 \rfloor$, and the quantity of elements in the puncturing set $|P1|=|P|-|P2|$, where R2 is $\frac{2}{3}$ or $\frac{1}{2}$.

Optionally, a method for selecting elements for the puncturing set and the shortening set may be as follows: elements in the shortening set are selected from an initial sequence v1 with length N, and elements in the puncturing set are selected from a bits reversal sequence v2 with length N. The initial sequence v1 with length N is $\{0, 1, 2, \ldots, N-1\}$, and the bits reversal sequence v2 is a sequence obtained by performing bits reversal on a binary form of each element in the initial sequence v1.

If an intersection set of leading $|P1|$ elements in the reversal sequence v2 and last $|P2|$ elements in the initial sequence v1 is empty, the puncturing set includes the leading

|P1| elements in the bits reversal sequence v2, and the shortening set includes the last |P2| elements in the initial sequence v1.

If the code rate R is equal to ⅓, the information bits length K is less than 64, the code length M is greater than 128, an intersection set of leading |P1| elements in the reversal sequence v2 and the last |P2| elements in the initial sequence v1 is not an empty set, and a quantity of elements in the intersection set is |P1∩P2|, the puncturing set includes a first element set and a third element set, the first element set includes elements in the leading |P1| elements in the reversal sequence v2 other than |P1∩P2| elements, the third element set includes leading $C_p$ elements in the reversal sequence v2 other than the first element set, and the |P1∩P2| elements include an element in the intersection set of the leading |P1| elements in the reversal sequence v2 and the last |P2| elements in the initial sequence v1; and the shortening set includes a second element set and a fourth element set, the second element set includes elements in the last |P2| elements in the initial sequence v1 other than the |P1∩P2| elements, and the fourth element set includes last $C_s$ elements in the initial sequence v1 other than the second element set and the third element set, where a maximum difference between $C_p$ and $C_s$ is 1, a sum of $C_p$ and $C_s$ is |P1∩P2|, and |P1∩P2|, $C_p$, and $C_s$ are all positive integers.

If the following conditions are not met: the code rate R is equal to ⅓, the information bits length K is less than 64, and the code length M is greater than 128, the puncturing set includes leading |P1| elements in the bits reversal sequence v2, and the shortening set includes last |P2| elements in the initial sequence v1 other than the elements in the puncturing set.

Specifically, that the puncturing set P1 and the shortening set P2 have no intersection set may be implemented by using the following method. No intersection set means that the puncturing set P1 and the shortening set P2 have no common elements. The method is as follows:

S2021: Obtain the leading |P1| elements in the reversal sequence v2 as the elements in the puncturing set P1:

(a) Initialize the sequence v1 {0, 1, 2, . . . , N−1} with length N, where v1 is referred to as the initial sequence, and N is the mother code length.

(b) Perform bits reverse on a binary sequence of each element in the initial sequence v1 with length N, to obtain a new sequence v2={0, N/2, . . . , N−1}, where v2 is referred to as the bits reversal sequence. Bits reverse performed on the binary sequence comprises, for example, a binary form of a sequence 1 is 0001 and a binary 1000 is obtained after bit reversal. In other words, the sequence 1 changes from 1 to 8. Herein, it is assumed that N is represented by using only four bits, and any other length is represented in a similar manner. It should be understood that this embodiment may support initial sequences with different lengths. Because the sequences have different lengths, elements in the sequences have different binary bit lengths. Any other modifications or replacements readily figured out by a person of ordinary skill in the art shall fall within the technical scope disclosed in the embodiments of the present invention.

(c) Select the leading |P1| elements in the bits reversal sequence v2 and add to the puncturing set P1.

S2022: Obtain the last |P2| elements in the initial sequence v1, and add the last |P2| elements to the shortening set.

A method comprises: generating a sequence {N−|P2|, N−|P2|+1, N−|P2|+2, . . . , N−1} and adding the sequence {N−|P2|, N−|P2|+1, N−|P2|+2, . . . , N−1} to the set P2. A codeword of the puncturing pattern generated by using a truncation method is known, therefore, bits generated by the truncation method at puncturing locations are decoded as known codeword during decoding process.

S2023: If the intersection set of the puncturing set P1 obtained in step S2021 and the shortening set P2 obtained in step S2022 is not an empty set, perform the following operations:

If |P1∩P2|≠∅, where the symbol ∩ indicates an intersection set obtained from two sets, a quantity of elements in the intersection set is |P1∩P2|, and ϕ indicates that a set is an empty set (in other words, two sets have no intersection set):

when R is equal to ⅓, the information bits length K is less than 64, and the code length M is greater than 128, a repeated element is separately removed from the puncturing set and the shortening set, to obtain the first element set of the puncturing set and the second element set of the shortening set; then the first $C_p$ elements are selected from elements in the reversal sequence v2 other than the first element set to obtain the third element set, and the third element set is added to the puncturing set, where $C_p = \lfloor ½·|P1∩P2| \rfloor$ or $C_p = \lceil ½·|P1∩P2| \rceil$; and the last $C_s$ elements are selected from elements in the initial sequence v1 other than the second element set and the third element set to obtain the fourth element set; in this case, the puncturing set includes the first element set and the third element set, and the shortening set includes the second element set and the fourth element set, where $C_s = \lceil ½·|P1∩P2| \rceil$ or $C_s = \lfloor ½·|P1∩P2| \rfloor$, the maximum difference between $C_p$ and $C_s$ is 1, and the sum of $C_p$ and $C_s$ is |P1∩P2|; or if the following conditions are not met: the code rate R is equal to ⅓, the information bits length K is less than 64, and the code length M is greater than 128, the puncturing set includes the leading |P1| elements in the bits reversal sequence v2, and the shortening set includes the last |P2| elements in the initial sequence v1 other than the elements in the puncturing set.

Through processing in S2023, the intersection set of the puncturing set and the shortening may be ensured to be empty.

S203: Perform rate matching on the information bits by using the determined puncturing pattern.

A puncturing operation performed by using the determined puncturing pattern meets an output code rate requirement of a system.

In this embodiment, a puncturing pattern may be flexibly generated for any different code rate and information bits length. In this embodiment, different code rates and information lengths are simulated, and performance degradation caused by using the solution in this embodiment is less than 0.3 dB compared with performance degradation caused by using a GA-construction-based Quasi-uniform Puncturing (QUP) algorithm. Table 1 lists performance simulation parameters.

TABLE 1

| Simulation parameters | |
|---|---|
| Channel | AWGN |
| Modulation | BPSK |
| Frozen set selection | PW/GA |
| Codeword construction | CA-Polar with 11-bit CRC |
| Puncturing pattern | Proposed/QUP |
| Decoding algorithm | CA-SCL with L = 8 |
| Information block size | K = [200, 120, 80] |
| Code rate | R = [1/6, 1/3, 1/2, 2/3] |

Figure 3A:
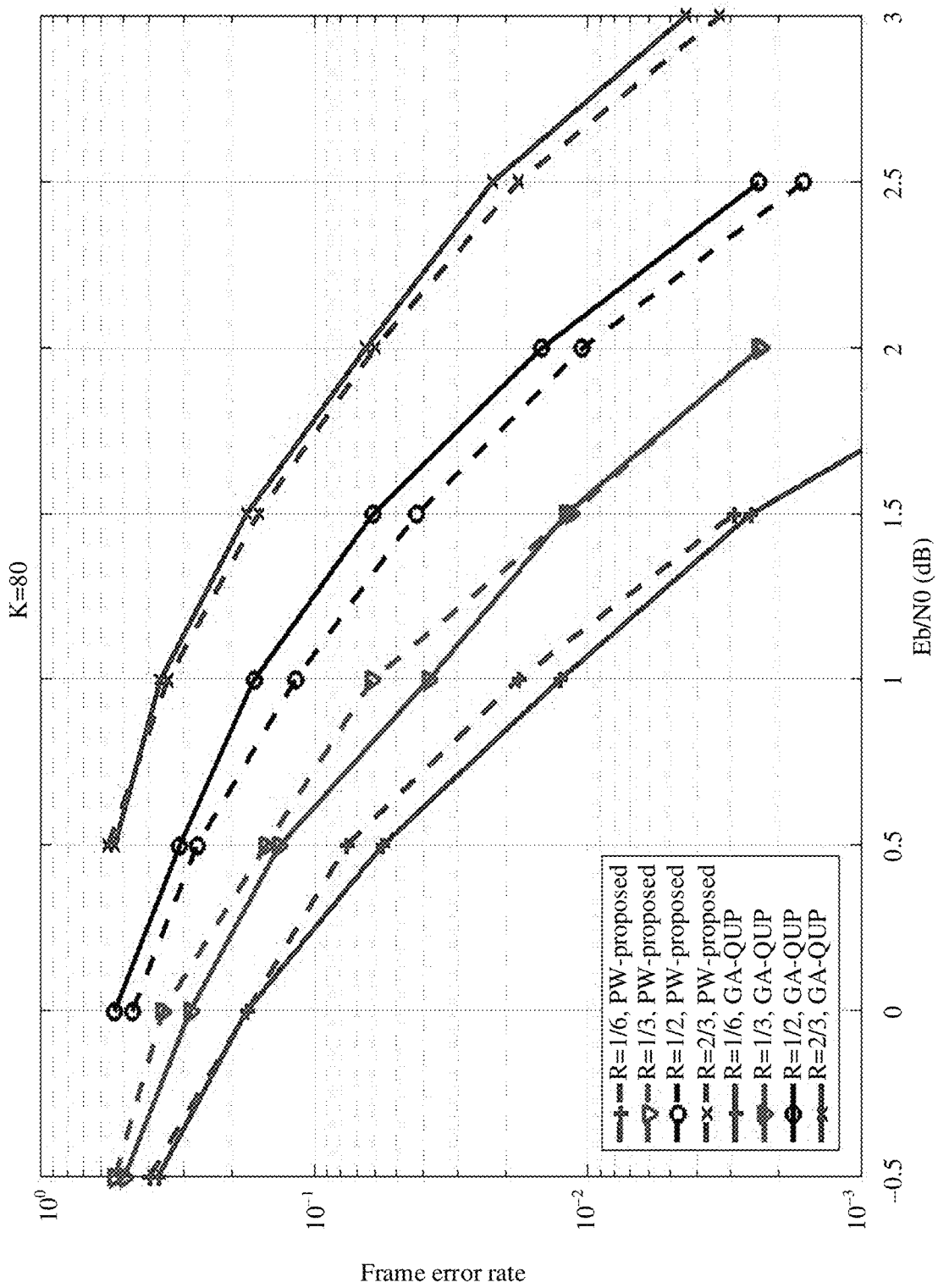
FIG. 3(a), FIG. 3(b) and FIG. 3(c) show simulation results according to an embodiment of the present disclosure.
Figure 3B:
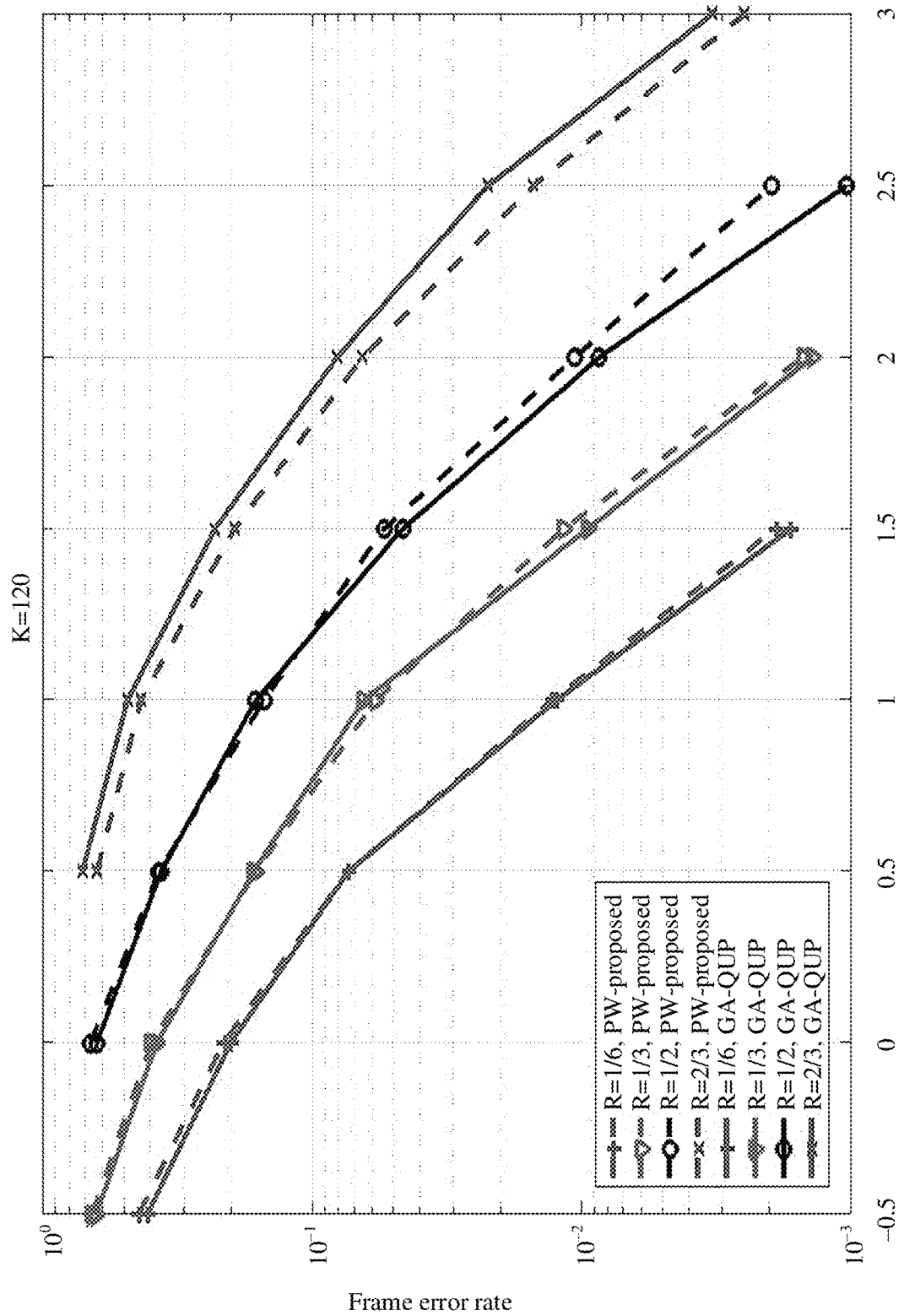
Figure 3C:
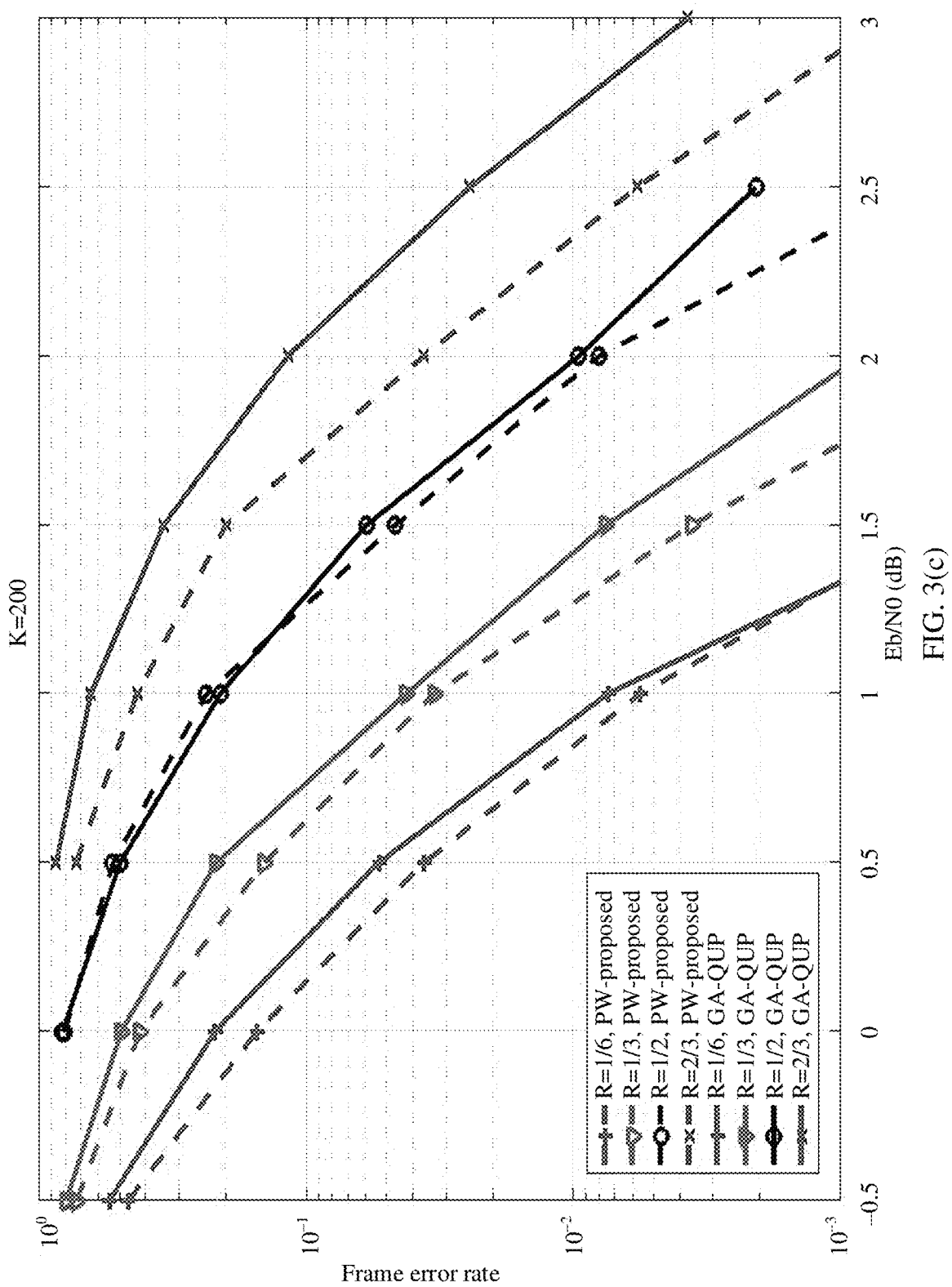

A channel used for simulation is an AWGN channel, a modulation scheme is binary phase shift keying (BPSK). Frozen set selection manners are PW and GA. A codeword is constructed by using an 11-bit cyclic redundancy check aided polar (CA-Polar) code. A puncturing pattern is generated according to the method in the foregoing embodiment, and a comparison solution is a QUP solution. A cyclic redundancy check aided successive cancellation list (CA-SCL) with length 8 is used as a decoding algorithm. An information block size is 200, 120, or 80, and a code rate is 1/6, 1/3, 1/2, or 2/3. FIG. 3(a) to FIG. 3(c) show simulation results according to an embodiment of this application. It can be seen from the simulation results that, when the puncturing pattern in this embodiment is used for puncturing, performance degradation is very small compared with the GA-construction-based QUP solution, and density evolution or Gaussian approximation does not need to be performed, thereby the computing complexity decreased. The solution in the present invention features in a low latency and low complexity, and therefore can be applied to an application scenario of a low-latency system.

According to this embodiment of the present invention, an advantage of an existing puncturing solution can be considered, the puncturing pattern is easy to be selected and implemented, and the requirements of low-latency and low-complexity can be met. When a code rate of encoding changes, a puncturing pattern may be generated quickly, and therefore a performance requirement may be met.

The following describes an example embodiment using the foregoing puncturing pattern generation process. In this embodiment, encoding parameter information is M=12, K=6, and R=1/2.

Step 1: Calculate a mother code length $N=2^{\lceil \log_2 12 \rceil}=16$ of a polar code.

Step 2: Calculate a length |P|=N−M=4 of a puncturing pattern, where when the code rate R is not greater than 1/2, $|P2|=\lfloor|P|/2\rfloor=2$, and |P1|=2.

Step 3: Determine elements of the puncturing pattern:

(1) Determine elements in P1: An initial sequence is v1={0, 1, 2, 3, 4, 5, 6, 7, 8, 9, 10, 11, 12, 13, 14, 15}, and a bits reversal sequence is v2={0, 8, 4, 12, 2, 10, 6, 14, 1, 9, 5, 13, 3, 11, 7, 15}; if two leading elements in v2 are selected and added to the set P1, P1={0, 8} is obtained.

(2) Determine elements P2={14, 15} is obtained, and the bits at these locations are treated as known during decoding.

(3) Determine the puncturing pattern: P=P1∪P2={0, 8, 14, 15}.

In another embodiment, encoding parameter information is M=24, K=16, and R=2/3.

Step 1: Calculate a mother code length $N=2^{\lceil \log_2 24 \rceil}=32$ of a polar code.

Step 2: Calculate a length "|P|=N−M=8" of a puncturing pattern, where when the code rate R is greater than 1/2, $|P2|=\lfloor|P|\times 2/3\rfloor=5$ and |P1|=3 are obtained.

Step 3: Determine elements of the puncturing pattern:

(1) Determine elements in P1: An initial sequence is v1={0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}, and a bits reversal sequence is v2 {0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31};

if leading three elements in v2 are selected and added to the set P1, P1={0, 16, 8} is obtained.

(2) Determine elements of P2: P2={27, 28, 29, 30, 31} is obtained, and bits at these locations are treated as known during decoding.

(3) Determine the puncturing pattern: P=P1∪P2={0, 16, 8, 27, 28, 29, 30, 31}.

The foregoing embodiments are only used to describe the puncturing pattern generation method, but are not limited to the foregoing encoding parameter information. It should be understood that a puncturing pattern may be obtained for any encoding parameter information by using the foregoing puncturing pattern generation methods. Any other modifications or replacements readily figured out by a person of ordinary skill in the art shall fall within the technical scope disclosed in the embodiments of the present invention.

In an optional solution, a puncturing pattern may not need to be dynamically calculated based on a code rate and an information bits length. Generally, in a communications system, choices of the code rate and an information bits length are limited. In addition, once the code rate and an information bits length are selected, the code rate and the information bits length remain unchanged in a specific time period. Therefore, the puncturing pattern does not need to be dynamically calculated each time. Some code rates and information bits lengths that need to be used may be predefined. During encoding, after a code rate and an information bits length are obtained, a puncturing pattern may be directly obtained through table lookup.

Specifically, the puncturing pattern is usually determined by using a modulation and coding scheme (MCS). According to the foregoing embodiment, the following puncturing pattern table may be obtained.

TABLE 2

Puncturing pattern

| Index | M | K | R | Puncturing pattern |
| --- | --- | --- | --- | --- |
| 0 | 24 | 16 | 2/3 | {0, 8, 16, 27, 28, 29, 30, 31} |
| 1 | 240 | 120 | 1/2 | {0, 128, 64, 192, 32, 160, 246, 247, 248, 249, 250, 251, 252, 253, 254, 255} |
| 2 | 56 | 42 | 3/4 | {0, 2, 32, 59, 60, 61, 62, 63} |

It should be understood that the foregoing is merely an example, and does not represent all possible scenarios of an actually applied puncturing pattern. In actual encoding, corresponding puncturing patterns may be obtained for different code lengths, information bits lengths, and code rates. A standard index may be an MCS index, and the MCS index may be used to distinguish different code rates and/or different information bits lengths. The index is mainly used to determine encoding parameter information corresponding to the index. A specific definition may depend on an actual protocol definition. Any other modifications or replacements readily figured out by a person of ordinary skill in the art shall fall within the technical scope disclosed in the embodiments of the present invention.

In this embodiment, puncturing patterns and frozen sets corresponding to some encoding parameter information are pre-calculated, so that the puncturing patterns and the frozen sets may be obtained quickly through table lookup. Therefore, an implementation is simple, and a low-latency requirement is met.

Figure 4:
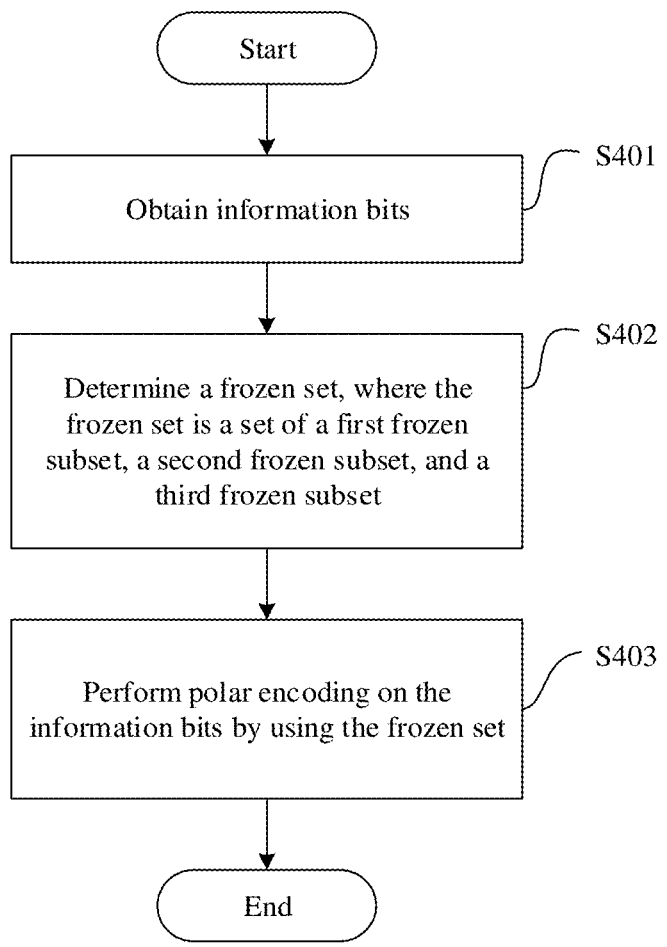
FIG. 4 is a flow chart of generating a frozen set according to an embodiment of the present disclosure.

FIG. 4 is a flow chart of generating a frozen set according to an embodiment of this application. Referring to FIG. 4, the method describes the frozen set generation method in FIG. 1 in detail, and includes the following steps.

S401: Obtain information bits.

S402: Determine a frozen set, where the frozen set is a union set of a first frozen subset, a second frozen subset, and a third frozen subset, and the third frozen subset is determined based on the first frozen subset and the second frozen subset.

A quantity of elements in the first frozen subset is |F1|, and is the same as the quantity of elements in the puncturing set |P1| in the foregoing embodiments. A quantity of elements in the second frozen subset is |F2|, and is the same as the quantity of elements in the shortening set |P2| in the foregoing embodiments.

In an embodiment, when R>½, the quantity of elements in the second frozen subset $|F2|=\lfloor |P| \times R1 \rfloor$, and the quantity of elements in the first frozen subset |F1|=|P|−|P2|, where R1 is ¾ or R, |P|=N−M, $N=2^{\lceil \log_2 M \rceil}$ is a mother code length, and M is a code length.

Alternatively, when R<⅓ and an information bits length K is less than or equal to 64, or when R is equal to ⅓ and the code length M is not greater than 128, the quantity of elements in the first frozen subset |F1|=|P|, and the quantity of elements in the second frozen subset |F2|=0.

Alternatively, when ⅓ CRS ½ or when R<⅓ and an information bits length K is greater than 64, or when R=⅓ and the code length M is greater than 128, the quantity of elements in the second frozen subset $|F2|=\lfloor |P| \times R2 \rfloor$, and the quantity of elements in the first frozen subset |F1|=|P|−|F2|, where R2 is ⅔ or ½.

After the quantity of elements in the first frozen subset and the quantity of elements in the second frozen subset are determined, elements in the frozen set F need to be further determined. A method is as follows: The first frozen subset includes leading |F1| elements in an initial sequence v1 with length N, and the second frozen subset includes last |F2| elements in a bits reversal sequence v2 with length N. The initial sequence v1 with length N is {0, 1, 2, . . . , N−1}, and the bits reversal sequence v2 is a sequence obtained by performing bits reversal on a binary form of each element in the initial sequence v1. The third frozen subset includes M−K elements with lowest reliability in the initial sequence other than the elements in the first frozen subset and the elements in the second frozen subset, where K is the information bits length, and M is the code length.

Specifically, the method for determining an element in the frozen set is as follows:

S4021: Determine elements of the first frozen subset, where the first frozen subset includes the leading |F1| elements in the initial sequence v1. In other words, the leading |F1| elements in the initial sequence v1 are selected as the elements in the first frozen subset F1, and F1={0, 1, 2, . . . , |P1|−1}.

S4022: Determine an element in the second frozen subset, where the second frozen subset includes the last |F2| elements in the bits reversal sequence v2 with length N. In other words, the last |F2| elements in the bits reversal sequence v2 are selected and added to the second frozen subset F2.

S4023: Determine the third frozen subset F3, where the third frozen subset includes the M−K elements with lowest reliability in the initial sequence other than the elements in the first frozen subset and the elements in the second frozen subset. In other words, the third frozen subset includes leading M−K elements in a sequence that is obtained after the elements of the first frozen subset and the elements of the second frozen subset are removed from a sequence obtained by sorting reliability measurement values at all locations in an input sequence in ascending order.

Specifically, a method for determining the third frozen subset is as follows: First, a reliability measurement value at each of N locations in the input sequence is calculated by using a PW algorithm. Then, the reliability measurement values at each location of the input sequence are sorted in ascending order to obtain a sorted sequence S, elements included in the first frozen subset F1 and the second frozen subset F2 are removed from the sequence S to obtain a sequence S', and the first M−K element of the sequence S' are selected as the frozen subset F3.

A method for calculating the reliability measurement value at each location is as follows: It is assumed that a location in the input sequence is i, and a binary of i is represented as $i=B_{n-1}, B_{n-2}, \ldots, B_0$, where $B_j \in \{0,1\}$, j=[0, 1, . . . , n−1]. A calculation expression is as follows:

$$W_i = \sum_{j=0}^{n-1} B_j \times 2^{j \times \frac{1}{4}}$$

Herein, $n=\log_2 N$, and $W_i$ represents a reliability measurement value at the location i in the input sequence.

S4024: The frozen set F is a union set of the determined first frozen subset F1, the determined second frozen subset F2, and the determined third frozen subset F3, in other words, F=F1∪F2∪F3.

S403: Perform polar encoding on the information bits by using the frozen set F.

According to this embodiment, the frozen set F may be quickly generated, to meet a low-latency requirement and a low-complexity requirement in an application scenario. With reference to the simulation performance in FIG. 3(a) to FIG. 3(c), when polar code encoding is performed by using the frozen set F in this embodiment, performance degradation is less than 0.3 dB compared with performance degradation caused by using the GA-based QUP algorithm, and complexity is greatly reduced. Therefore, a low-latency requirement in future 5G may be met.

The following describes an example embodiment using the foregoing frozen set generation process. In this embodiment, encoding parameter information is M=12, K=6, and R=½.

Step 1: Calculate a mother code length $N=2^{\lceil \log_2 12 \rceil}=16$ of a polar code.

Step 2: Calculate a length |P|=N−M=4 of a puncturing pattern, where when a code rate R is not greater than ½, $|F2|=\lfloor |P|/2 \rfloor=2$, and |F1|=2.

Step 3: Determine the frozen set F.

(1) Determine the elements of the first frozen subset F1: An initial sequence is v1={0, 1, 2, 3, 4, 5, 6, 7, 8, 9, 10, 11, 12, 13, 14, 15}, a bits reversal sequence is v2={0, 8, 4, 12, 2, 10, 6, 14, 1, 9, 5, 13, 3, 11, 7, 15}, and F1={0, 1}.

(2) Determine the elements of the second frozen subset F2: F2={7, 15}.

(3) Determine the third frozen subset F3: A sequence that is obtained based on the PW by sorting reliability at a bit location and with code length 16 is: S={0, 1, 2, 4, 8, 3, 5, 6, 9, 10, 12, 7, 11, 13, 14, 15}; because {0, 1, 7, 15} is already selected as the frozen set F, a set obtained by removing these elements is {2, 4, 8, 3, 5, 6, 9, 10, 12, 11, 13, 14}, then the leading six elements are selected and added to the set, and F3={2, 4, 8, 3, 5, 6}.

(4) Determine the frozen set F=F1∪F2∪F3={0, 1, 2, 3, 4, 5, 6, 7, 8, 15}.

In another instance, encoding parameter information is M=24, K=16, and R=⅔.

Step 1: Calculate a mother code length $N=2^{\lceil \log_2 24 \rceil}=32$ of a polar code.

Step 2: Calculate a length |P|=N−M=8 of a puncturing pattern, where when a code rate R is greater than ½, |F2|=⌊|P|×⅔⌋=5, and |F1|=3.

Step 3: Determine the frozen set F.

(1) Determine the elements of the first frozen subset F1: An initial sequence is:

v1={0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}, a bits reversal sequence is:

v2={0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31} and F1={0, 1, 2}.

(2) Determine the elements of the second frozen subset F2: F2={27, 7, 23, 15, 31}.

(3) Determine the elements of the third frozen subset F3: A sequence that is obtained based on the PW by sorting reliability at a bit location and with code length 16 is:

S={0, 1, 2, 4, 8, 16, 3, 5, 6, 9, 10, 17, 12, 18, 20, 7, 24, 11, 13, 19, 14, 21, 22, 25, 26, 28, 15, 23, 27, 29, 30, 31};

because {0, 1, 2, 7, 15, 23, 27, 31} is already selected as the frozen set, a set obtained by removing these elements is:

{4, 8, 16, 3, 5, 6, 9, 10, 17, 12, 18, 20, 24, 11, 13, 19, 14, 21, 22, 25, 26, 28, 29, 30}, then leading eight elements are selected and added to the set, and F3={4, 8, 16, 3, 5, 6, 9, 10}.

(4) Determine the frozen set F=F1∪F2∪F3={0, 1, 2, 3, 4, 5, 6, 7, 8, 9, 10, 15, 16, 23, 27, 31}.

The foregoing instances are only used to describe the frozen set generation method, but are not limited to the foregoing encoding parameter information. It should be understood that a frozen subset may be obtained for any encoding parameter information by using the foregoing frozen set generation methods. Any other modifications or replacements readily figured out by a person of ordinary skill in the art shall fall within the technical scope disclosed in the embodiments of the present invention.

In an optional solution, a frozen set may not need to be dynamically calculated based on a code rate and an information bits length. Generally, in a communications system, choices for a code rate and an information length are limited. In addition, once a code rate and an information bits length are selected, the code rate and the information bits length remain unchanged in a specific time period. Therefore, the frozen set does not need to be dynamically calculated each time. Some code rates and information bits lengths that need to be used may be predefined. During encoding, after a code rate and an information bits length are obtained, a frozen set may be directly obtained through table lookup.

Specifically, the frozen set is usually determined by using a modulation and coding scheme (MCS). According to the foregoing embodiments, the following frozen set may be obtained as an example:

TABLE 3

| | | | | Frozen set |
|---|---|---|---|---|
| Index | M | K | R | Frozen set |
| 0 | 24 | 16 | 2/3 | {0, 1, 2, 3, 4, 5, 6, 7, 8, 9, 10, 15, 16, 23, 27, 31} |
| 1 | 56 | 42 | 3/4 | {0, 1, 2, 55, 15, 47, 31, 63, 4, 8, 16, 3, 32, 5, 6, 9, 10, 17, 12, 18, 33, 20} |

It should be understood that the foregoing is merely an example, and does not represent all possible scenarios of an actually applied frozen set. In actual encoding, corresponding frozen sets may be obtained for different code lengths, information bits lengths, and code rates. A standard index may be an MCS index, and is mainly used to determine encoding parameter information corresponding to the index. A specific definition may depend on an actual protocol definition. Any other modifications or replacements readily figured out by a person of ordinary skill in the art shall fall within the technical scope disclosed in the embodiments of the present invention.

In this embodiment, puncturing patterns and frozen sets corresponding to some encoding parameter information are pre-calculated, so that the puncturing patterns and the frozen sets can be obtained quickly through table lookup. Therefore, an implementation is simple, and a low-latency requirement is met.

In the foregoing embodiments, the puncturing pattern and the frozen set are independently generated. In a possible solution, a puncturing pattern and a frozen set may be jointly generated, in other words, both the puncturing pattern and the frozen set are generated.

Figure 5:
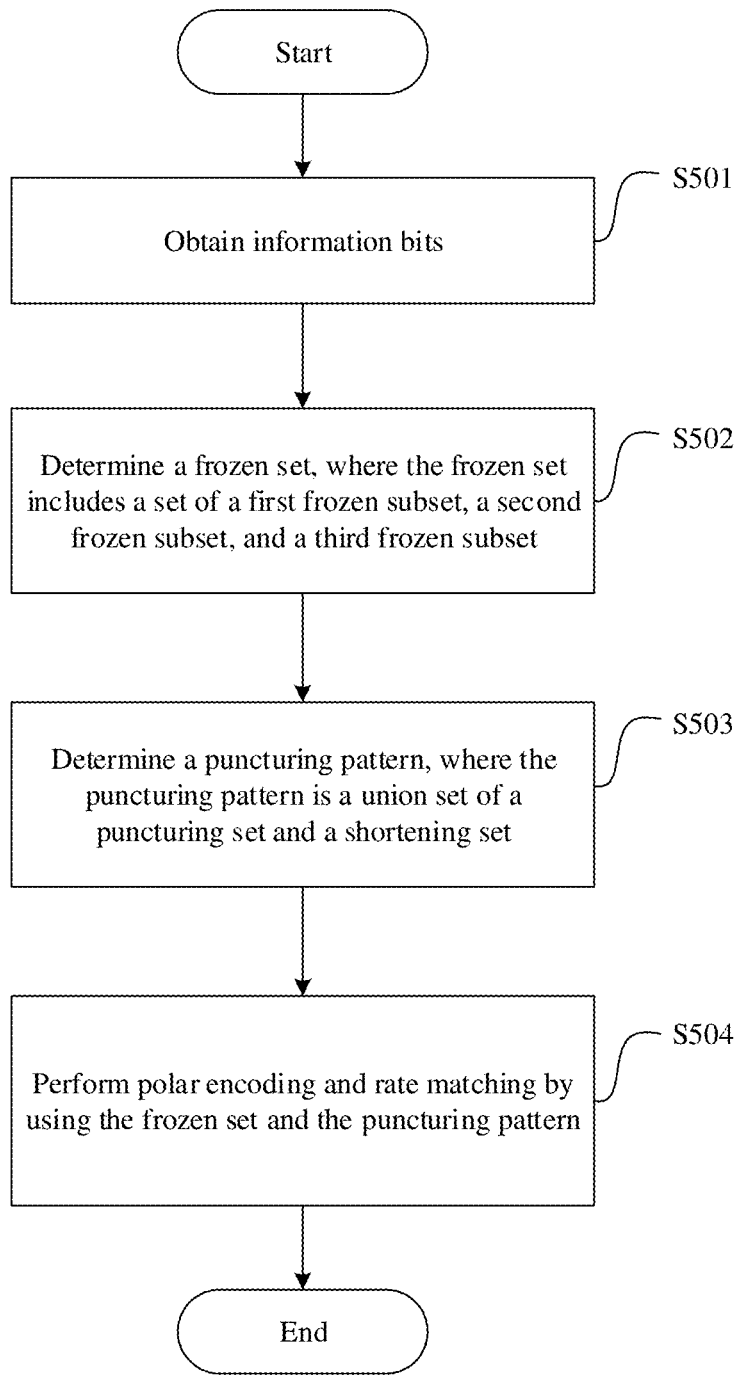
FIG. 5 is a flow chart of jointly generating a puncturing pattern and a frozen set according to an embodiment of the present disclosure.

FIG. 5 is a flow chart of jointly generating a puncturing pattern P and a frozen set F according to an embodiment of the present disclosure. Referring to FIG. 5, in this embodiment, the frozen set F and the puncturing pattern P are jointly generated, and the puncturing pattern P and the frozen set F do not need to be separately generated. The following steps are included.

S501 is the same as step S401.

S502 is the same as S402. However, in this step, a quantity of elements in the puncturing pattern |P|=N−M, where $N=2^{\lceil \log_2 M \rceil}$ is a mother code length, and M is a code length, a quantity of elements in a shortening set |P2|, and a quantity of elements in a puncturing set |P1| are all determined, and the quantity of elements in the shortening set |P2| is the same as a quantity of elements in a second frozen subset |F2|, and the quantity of elements in the puncturing set |P1| is the same as a quantity of elements in a first frozen subset |F1|. Other details of this step are described in S402.

S503: Determine the puncturing pattern P, where the puncturing pattern P includes a union set of the puncturing set P1 and the shortening set P2, and the puncturing set P1 and the shortening set P2 have no intersection set.

A method for determining the puncturing pattern P is the same as that in step S202 in FIG. 2.

S504: Perform encoding and rate matching by using the frozen set F and the puncturing pattern P.

The following describes an example process for jointly generating a puncturing pattern P and a frozen set F. In this embodiment, input encoding parameter information is M=12, K=6, and R=½.

Step 1: Calculate a mother code length $N=2^{\lceil \log_2 12 \rceil}=16$ of a polar code.

Step 2: Calculate a length |P|=N−M=4 of a puncturing pattern, where when the code rate R is not greater than ½, |P2|=⌊|P|/2⌋=2, and |P1|=2.

Step 3: Determine the frozen set F:

(1) Determine the elements of the first frozen subset F1: An initial sequence is v1={0, 1, 2, 3, 4, 5, 6, 7, 8, 9, 10, 11, 12, 13, 14, 15}, and a bits reversal sequence is v2={0, 8, 4, 12, 2, 10, 6, 14, 1, 9, 5, 13, 3, 11, 7, 15}; and if two leading elements in the initial sequence are selected, F1={0, 1} is obtained.

(2) Determine the elements of the second frozen subset F2: If the last two elements in the bits reversal sequence are selected, F2={7, 15}.

(3) Determine the third frozen subset F3: A sequence that is obtained based on the PW by sorting reliability at a bit location and with code length 16 is: S={0, 1, 2, 4, 8, 3, 5, 6, 9, 10, 12, 7, 11, 13, 14, 15}; because {0, 1, 7, 15} is already selected as the frozen set, a set obtained by removing these elements is {2, 4, 8, 3, 5, 6, 9, 10, 12, 11, 13, 14}, then the first six elements are selected and added to the set, and F3={2, 4, 8, 3, 5, 6}.

(4) Determine the frozen set F=F1∪F2∪F3={0, 1, 2, 3, 4, 5, 6, 7, 8, 15}.

Step 4: Determine elements in the puncturing pattern P:

(1) Determine elements of the puncturing set P1: If two leading elements in v2 are selected and added to the set v2, P1={0, 8} is obtained.

(2) Determine elements of the shortening set P2: P2={14, 15}, and the bits at these locations are treated as known during decoding.

(3) Determine the puncturing pattern P: P=P1∪P2={0, 8, 14, 15}.

In another instance, encoding parameter information is M=24, K=16 and R=⅔.

Step 1: Calculate a mother code length $N=2^{\lceil \log_2 24 \rceil}=32$ of a polar code.

Step 2: Calculate a length |P|=N−M=8 of a puncturing pattern P, where when a code rate R is greater than ½, |P2|=⌊|P|×⅔⌋=5, and |P1|=3.

Step 3: Determine the frozen set F:

(1) Determine the element in the first frozen subset F1: An initial sequence v1 is:

v1={0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}, the bits reversal sequence v2 is v2={0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31};

and if three leading elements in the initial sequence v1 are selected,

F1={0, 1, 2} is obtained.

(2) Determine the element in the second frozen subset F2: If the last five elements in the bits reversal sequence are selected, F2={27, 7, 23, 15, 31} is obtained.

(3) Determine the third frozen subset F3: A sequence that is obtained based on the PW by sorting reliability at a bit location and with code length 16 is:

S={0, 1, 2, 4, 8, 16, 3, 5, 6, 9, 10, 17, 12, 18, 20, 7, 24, 11, 13, 19, 14, 21, 22, 25, 26, 28, 15, 23, 27, 29, 30, 31};

because {0, 1, 2, 7, 15, 23, 27, 31} is already selected as the frozen set F, a set obtained by removing these element is:

{4, 8, 16, 3, 5, 6, 9, 10, 17, 12, 18, 20, 24, 11, 13, 19, 14, 21, 22, 25, 26, 28, 29, 30}, then eight leading elements are selected and added to the set, and F3={4, 8, 16, 3, 5, 6, 9, 10}.

(4) Determine the frozen set F=F1∪F2∪F3={0, 1, 2, 3, 4, 5, 6, 7, 8, 9, 10, 15, 16, 23, 27, 31}.

Step 4: Determine elements in the puncturing pattern:

(1) Determine elements of the puncturing set P1: If three leading elements in v2 are selected and added to the set P1, P1={0, 16, 8} is obtained.

(2) Determine element of the shortening set P2: P2={27, 28, 29, 30, 31}, and decoding is performed based on known values of bits at these locations.

(3) Determine the puncturing pattern P: P=P1∪P2={0, 16, 8, 27, 28, 29, 30, 31}.

The method for generating a frozen set and a puncturing pattern is described only by using the instances, but is not limited to the foregoing specified encoding parameter information. It should be understood that, for any encoding parameter information, a frozen set and a puncturing pattern may be obtained by using the foregoing method to generate a frozen set and a puncturing pattern. Any other modifications or replacements readily figured out by a person of ordinary skill in the art shall fall within the technical scope disclosed in the embodiments of the present invention.

In the foregoing embodiment, the quantity of elements in each of the puncturing set and the shortening set, and the quantity of elements in each of the first frozen subset and the second frozen subset are generated at a time, and the puncturing pattern and the frozen set are obtained by using the initial sequence and the bits reversal sequence. This solution is simple and has low complexity.

In an optional solution, a puncturing pattern and a frozen set may not need to be dynamically calculated based on a code rate and an information bits length. Generally, in a communications system, choices for a code rate and an information length are limited. In addition, once a code rate and an information bits length are selected, the code rate and the information length remain unchanged in a specific time period. Therefore, the puncturing pattern and the frozen set do not need to be dynamically calculated from time to time. Some code rates and information bits lengths that need to be used may be predefined. During encoding, after a code rate and an information bits length are obtained, a puncturing pattern and a frozen set may be directly obtained through table lookup.

Specifically, the frozen set is usually determined by using a modulation and MCS. According to the foregoing embodiments, the following frozen set and puncturing pattern may be obtained as an example:

TABLE 4

Frozen set and puncturing pattern

| Index | M | K | R | Puncturing pattern | Frozen set |
|---|---|---|---|---|---|
| 0 | 24 | 16 | 2/3 | {0, 8, 16, 27, 28, 29, 30, 31} | {0, 1, 2, 3, 4, 5, 6, 7, 8, 9, 10, 15, 16, 23, 27, 31} |
| 1 | 56 | 42 | 3/4 | {0, 128, 64, 192, 32, 160, 246, 247, 248, 249, 250, 251, 252, 253, 254, 255} | {0, 1, 2, 55, 15, 47, 31, 63, 4, 8, 16, 3, 32, 5, 6, 9, 10, 17, 12, 18, 33, 20} |

It should be understood that the foregoing is merely an example, and does not represent all possible scenarios of an actually applied puncturing pattern and an actually applied frozen set. In actual encoding, corresponding puncturing patterns and frozen sets may be obtained for different code lengths, information bits lengths, and code rates. A standard index may be an MCS index, and is mainly used to determine encoding parameter information corresponding to the index. A specific definition may depend on an actual protocol definition. Any other modifications or replacements readily figured out by a person of ordinary skill in the art shall fall within the technical scope disclosed in the embodiments of the present invention.

In this embodiment, puncturing patterns and frozen sets corresponding to some encoding parameter information are pre-calculated, so that the puncturing patterns and the frozen sets can be obtained quickly through table lookup. Therefore, an implementation is simple, and a low-latency requirement is met.

The foregoing mainly describes the solutions provided in the embodiments of this disclosure from a perspective of an encoding process and generating a puncturing pattern and a frozen set by a device for encoding. It may be understood that, to implement the foregoing functions, the device for encoding may include corresponding hardware structures and/or software modules for executing the functions. A person of ordinary skill in the art should easily be aware that, in combination with the examples described in the embodiments disclosed in this application, algorithm steps may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this disclosure.

In the embodiments of this disclosure, the device for encoding may be divided into functional modules based on the foregoing method examples. For example, functional modules corresponding to various functions are obtained through division, or two or more functions may be integrated into one processing module. The integrated module may be implemented in a form of hardware, or may be implemented in a form of a software functional module. It should be noted that, in this embodiment of this disclosure, module division is an example, and is merely a logical function division. In an alternative implementation, another division manner may be used.

Figure 6:
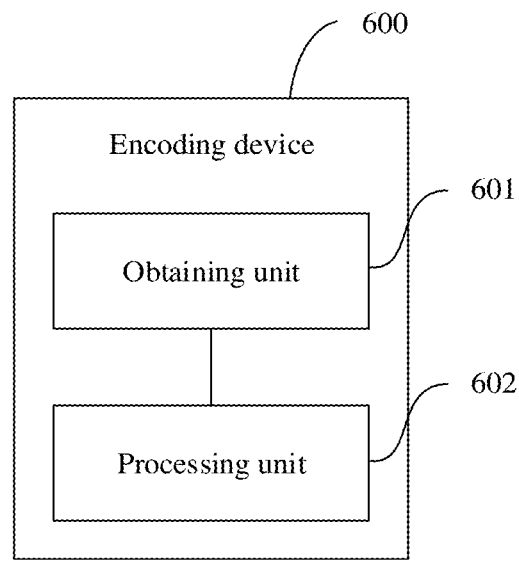
FIG. 6 is a schematic structural diagram of an encoding device for generating a puncturing pattern according to an embodiment of the present disclosure.

When the functional modules corresponding to various functions are obtained through division, FIG. 6 is a schematic structural diagram of an encoding device for generating a puncturing pattern according to an embodiment of the present disclosure. The device 600 includes an obtaining unit 601 and a processing unit 602. The obtaining unit 601 is configured for the device to perform step S201 of obtaining information bits in FIG. 2. The processing unit 602 is configured for the device to perform step S202 of determining a puncturing pattern in FIG. 2, and the processing unit 602 is further configured for the device to perform step S402 of determining a frozen set in FIG. 4 and step S503 of determining a puncturing pattern in FIG. 5, and the processing unit 602 is further configured to support the device 600 in performing, by using the puncturing pattern, rate matching on data obtained after the information bits are encoded.

Optionally, the device 600 may be a chip or an integrated circuit in another implementation.

Figure 7:
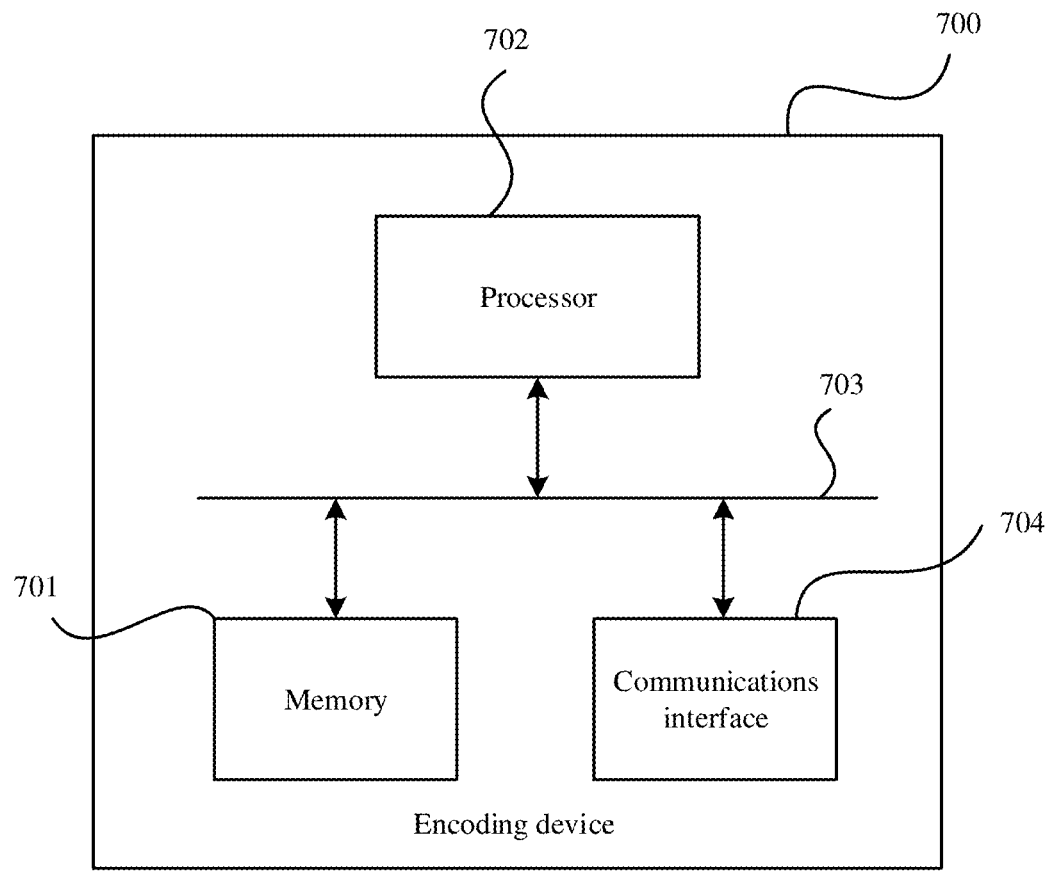
FIG. 7 is a schematic diagram of a logical structure of an encoding device for generating a puncturing pattern according to an embodiment of the present disclosure.

Optionally, when a part or all of the encoding methods in the foregoing embodiments are implemented by using software, FIG. 7 is a schematic diagram of a logical structure of an encoding device 700 for generating a puncturing pattern according to embodiments of the present disclosure. The device 700 includes a processor 702, which is configured to execute a program stored in a memory 701. When the program is executed, the device 700 is enabled to implement the puncturing pattern generation methods provided in the embodiments in FIG. 2 and FIG. 5, and the frozen set generation method provided in the embodiment in FIG. 4, and to perform encoding and rate matching respectively, by using a frozen set and a puncturing pattern, on data obtained after information bits are encoded. Optionally, the device 700 may further include the memory 701, a communications interface 704, or a bus 703. The memory 701 is configured to store the program and data. The communications interface 704 is configured for the device 700 to obtain the information bits or send encoded bit information. The processor 702, the memory 701, and the communications interface 704 are connected to each other by using the bus 703. The processor 702 may receive data from the communications interface 704 or the memory 701 by using the bus 703, or transmit the data to the memory 701 by using the bus 703 for storage, or send the data to the communications interface 704 for sending.

Optionally, the memory 701 may be a physically independent unit, or may be integrated into the processor 702.

The processor 702 may be a central processing unit (CPU), a network processor (NP), or a combination of a CPU and an NP.

The processor 702 may further include a hardware chip. The foregoing hardware chip may be an application-specific integrated circuit (ASIC), a programmable logic device (PLD), or a combination thereof. The PLD may be a complex programmable logic device (CPLD), a field programmable gate array (FPGA), a generic array logic (GAL), or any combination thereof.

The memory 701 may include a volatile memory, for example, a random-access memory (RAM); the memory 701 may also include a non-volatile memory, for example, a flash memory, a hard disk drive (HDD), or a solid-state drive (SSD); or the memory 701 may further include a combination of the foregoing types of memories.

The bus 703 may be a peripheral component interconnect (PCI) bus, an extended industry standard architecture (EISA) bus, and or the like. The bus 703 may be classified into an address bus, a data bus, a control bus, and the like. For ease of representation, only one thick line is used to represent the bus 703 in FIG. 7, but this does not mean that there is only one bus or only one type of bus.

In another embodiment of the present disclosure, a readable storage medium is further provided. The readable storage medium stores one or more computer-executable instructions, and a device (which may be a single-chip microcomputer, a chip, or the like) or a processor loads the one or more computer-executable instructions from the storage medium, to execute the base station or the terminal to complete the method provided in the embodiments of the present application. The foregoing readable storage medium may include: any medium that can store program code, such as a removable hard disk, a read-only memory, a random access memory, a magnetic disk, or an optical disc.

In another embodiment of this disclosure, a computer program product is further provided. The computer program product includes one or more computer-executable instructions, and the one or more computer-executable instructions are stored in a computer-readable storage medium. At least one processor of a device may read the one or more computer-executable instructions from the computer-readable storage medium, and the at least one processor executes the one or more computer-executable instructions to implement the method provided in the embodiments of this disclosure.

In the embodiments of this disclosure, the puncturing pattern is easy to be selected and implemented, and the frozen set can be quickly generated. In this way, the complexity is greatly reduced, and both a low-latency requirement and a low-complexity requirement can be met. When the code rate of encoding changes, the puncturing pattern and/or the frozen set can be quickly generated, so that the requirement of a low latency in the future 5G can be met.

In conclusion, the foregoing descriptions are merely example implementations of the present disclosure, but are not intended to limit the protection scope of the present disclosure. Any variation or replacement within the technical scope disclosed in the present disclosure shall fall within the protection scope of the present disclosure. Therefore, the protection scope of the present disclosure shall be subject to the protection scope of the claims.

What is claimed is:

1. A device for rate matching, comprising:
   a memory, and
   at least one processor, wherein the at least one processor is configured to:
   obtain information bits;
   determine a puncturing pattern, wherein the puncturing pattern comprises an element in a puncturing set and an element in a shortening set, the puncturing set and the shortening set have no intersection set; and
   perform, by using the determined puncturing pattern, rate matching on data obtained after the obtained information bits are encoded.

2. The device according to claim 1, wherein the puncturing pattern comprises |P| elements, |P| being equal to N−M, N being a mother code length, M being a code length, and N being equal to $2^{\lceil log_2 M \rceil}$.

3. The device according to claim 1, wherein a quantity of elements in the puncturing pattern is |P|,
   when a code rate R is larger than ½, a quantity of elements in the shortening set |P2| is equal to $\lfloor |P| \times R1 \rfloor$, and a quantity of elements in the puncturing set |P1| is equal to |P|−|P2|, R1 being ¾ or R; or
   when the code rate R is less than ⅓ and an information bit length is less than or equal to 64, or when R is equal to ⅓ and the code length M is not greater than 128, the quantity of elements in the puncturing set |P1| is equal to P, and the quantity of elements in the shortening set |P2| is equal to 0; or
   when the code rate R is larger than ⅓ and less than or equal to ½, or when the code rate R is less than ⅓ and the information bit length K is greater than 64, or when the code rate R is equal to ⅓ and the code length M is greater than 128, the quantity of elements in the shortening set |P2| is equal to $\lfloor |P| \times R2 \rfloor$, and the quantity of elements in the puncturing set |P1| is equal to |P|−|P2|, wherein R2 is ⅔ or ½.

4. The device according to claim 1, wherein elements in the shortening set are selected from an initial sequence v1 with a length N, and elements in the puncturing set are selected from a bits reversal sequence v2 with a length N; and
   the initial sequence v1 is {0, 1, 2, ..., N−1}, and the bits reversal sequence v2 is a sequence obtained by performing bits reversal on a binary form of each element in the initial sequence v1.

5. The device according to claim 4, wherein
   a quantity of elements in the puncturing set is |P1| and a quantity of elements in the shortening set is |P2|,
   the puncturing set comprises leading |P1| elements in the reversal sequence v2, and
   the shortening set comprises last |P2| elements in the initial sequence v1.

6. The device according to claim 4, wherein a quantity of elements in the puncturing set is |P1| and a quantity of elements in the shortening set is |P2|, and
   the at least one processor is further configured to:
   determine whether a first condition is met, the first condition comprising a code rate R is equal to ⅓, an information bit length K is less than 64, a code length M is greater than 128, an intersection set of leading |P1| elements in the reversal sequence v2 and the last |P2| elements in the initial sequence v1 is not an empty set, and a quantity of elements in the intersection set is |P1∩P2|,
   in response to the determination that the first condition is met, determine that the puncturing set comprises a first element set and a third element, the first element set comprising elements in the leading |P1| elements in the reversal sequence v2 other than |P1∩P2| elements, the third element set comprising leading $C_p$ elements in the reversal sequence v2 other than the first element set, and the |P1∩P2| elements comprising elements in the intersection set of the leading |P1| elements in the reversal sequence v2 and the last |P2| elements in the initial sequence v1, and determine that the shortening set comprises a second element set and a fourth element set, the second element set comprising elements in the last |P2| elements in the initial sequence v1 other than the |P1∩P2| elements, and the fourth element set comprising last $C_s$ elements in the initial sequence v1 other than the second element set and the third element set; and
   determine whether a second condition is met, the second condition comprising the code rate R is equal to ⅓, the information bit length K is less than 64, and the code length M is greater than 128,
   in response to the determination that the second condition is not met, determine that the puncturing set comprises leading |P1| elements in the bits reversal sequence v2, and the shortening set comprises last |P2| elements in the initial sequence v1 other than the elements in the puncturing set.

7. A device for encoding, comprising:
   a memory and at least one processor, wherein the at least one processor is configured to:
   obtain information bits,
   determine a frozen set comprising a first frozen subset, a second frozen subset, and a third frozen subset, wherein the third frozen subset is determined based on the first frozen subset and the second frozen subset, and the third frozen subset comprises elements with lowest reliability in an initial sequence v1 other than elements in the first frozen subset and elements in the second frozen subset; and
   perform polar encoding on the obtained information bits by using the determined frozen set.

8. A device for encoding, comprising:
   a memory and at least one processor, wherein the at least one processor is configured to:
   obtain information bits,
   determine a frozen set comprising a first frozen subset, a second frozen subset, and a third frozen subset, and the third frozen subset being determined based on the first frozen subset and the second frozen subset; and
   perform polar encoding on the obtained information bits by using the determined frozen set, wherein the second frozen set comprises |P2| elements,
   when a code rate R is larger than ½, a quantity of elements in the second frozen subset |F2| is equal to $\lfloor |P| \times R1 \rfloor$, and a quantity of elements in the first frozen subset |F1| is equal to |P|−|P2|, wherein R1 is equal to ¾ or the code rate R, |P| is equal to N−M, N is a mother code length, M is a code length and N is equal to $2^{\lceil log_2 M \rceil}$; or
   when the code rate R is smaller than ⅓ and an information bit length K is less than or equal to 64, or when R is equal to ⅓ and the code length M is not greater than 128, the quantity of elements in the first frozen subset |F1| is equal to |P|, and the quantity of elements in the second frozen subset |F2| is equal to 0; or
   when the code rate R is larger than ⅓ and less than or equal to ½, or when the code rate R is less than ⅓ and the information bit length K is greater than 64, or when the code rate R is ⅓ and the code length M is greater than 128, the quantity of elements in the second frozen subset |F2| is equal to ⌊|P|×R2⌋, and the quantity of elements in the first frozen subset |F1| is equal to |P|−|F2|, wherein R2 is ⅔ or ½.

9. The device according to claim 8, wherein the first frozen subset comprises leading |F1| elements in an initial sequence v1 with a length N, and the second frozen subset comprises last |F2| elements in a bits reversal sequence v2 with a length N; and the initial sequence v1 is {0, 1, 2, . . . , N−1}, and the bits reversal sequence v2 is a sequence obtained by performing bits reversal on a binary form of each element in the initial sequence v1.

10. The device according to claim 8, wherein
the third frozen subset comprises M−K elements with lowest reliability in the initial sequence other than the elements in the first frozen subset and the elements in the second frozen subset, wherein K is the information bit length.

11. A device for encoding, comprising:
a memory and at least one processor, wherein the at least one processor is configured to:
obtain information bits,
determine a frozen set comprising a first frozen subset, a second frozen subset, and a third frozen subset, and the third frozen subset being determined based on the first frozen subset and the second frozen subset; and
perform polar encoding on the obtained information bits by using the determined frozen set,
wherein the at least one processor is further configured to:
determine a puncturing pattern, wherein the puncturing pattern comprises a puncturing set and a shortening set, and the puncturing set and the shortening set have no intersection set; and perform rate matching on the encoded information bits by using the determined puncturing pattern.

12. The device according to claim 11, wherein
a quantity of elements in the shortening set is the same as the quantity of elements in the second frozen set, and a quantity of elements in the puncturing set is the same as the quantity of elements in the first frozen subset.

13. A rate matching method, comprising:
obtaining information bits;
determining a puncturing pattern, wherein the puncturing pattern comprises an element in a puncturing set and an element in a shortening set, and the puncturing set and the shortening set have no intersection set; and
performing, by using the determined puncturing pattern, rate matching on data obtained after the obtained information bits are encoded.

14. The method according to claim 13, wherein the puncturing pattern comprises |P| elements, |P| being equal to N−M, N being a mother code length, M being a code length, and N being equal to $2^{\lceil log_2 M \rceil}$;

when a code rare R is larger than ½, a quantity of elements in the shortening set |P2| is equal to ⌊|P|×R1⌋, and a quantity of elements in the puncturing set |P1| is equal to |P|−|P2|, wherein R1 is ¾ or R; or when the code rate is less than ⅓ and an information bit length K is less than or equal to 64, or when the code rate R is equal to ⅓ and the code length M is not greater than 128, the quantity of elements in the puncturing set |P1| is equal to |P|, and the quantity of elements in the shortening set |P2| is equal to 0; or when the code rate R is larger than ⅓ and less than or equal to ½, or when the code rate R is less than ⅓ and the information bit length K is greater than 64, or when the code rate R is ⅓ and the code length M is greater than 128, the quantity of elements in the shortening set |P2| is equal to ⌊|P|×R2⌋, and the quantity of elements in the puncturing set |P1| is equal to |P|−|P2|, wherein R2 is ⅔ or ½.

15. A polar encoding method, comprising:
obtaining information bits;
determining a frozen set, wherein the frozen set comprises a first frozen subset, a second frozen subset, and a third frozen subset, the third frozen subset is determined based on the first frozen subset and the second frozen subset, and the third frozen subset comprises elements with lowest reliability in an initial sequence other than elements in the first frozen subset and elements in the second frozen subset; and
performing polar encoding on the obtained information bits by using the determined frozen set.

16. A polar encoding method, comprising:
obtaining information bits;
determining a frozen set, wherein the frozen set comprises a first frozen subset, a second frozen subset, and a third frozen subset, and the third frozen subset is determined based on the first frozen subset and the second frozen subset; and
performing polar encoding on the obtained information bits by using the determined frozen set, wherein the second frozen set comprises |P2| elements, when a code rate R is larger than ½, a quantity of elements in the second frozen subset |F2| is equal to ⌊|P|×R1⌋, and a quantity of elements in the first frozen subset |F1| is equal to |P|−|P2|, wherein R1 is ¾ or the code rate R, |P| is equal to N−M, N is a mother code length, M is a code length, and N is equal to $2^{\lceil log_2 M \rceil}$; or when the code rate R is less than ⅓ and an information bit length K is less than or equal to 64, or when the code rate R is equal to ⅓ and the code length M is not greater than 128, the quantity of elements in the first frozen subset |F1| is equal to |P|, and the quantity of elements in the second frozen subset |F2| is equal to 0; or when the code rate R is larger than ⅓ and less than or equal to ½, or when the code rate R is less than ⅓ and the information bit length K is greater than 64, or when the code rate R is equal to ⅓ and the code length M is greater than 128, the quantity of elements in the second frozen subset |F2| is equal to ⌊|P|×R2⌋, and the quantity of elements in the first frozen subset |F1| is equal to |P|−|F2|, wherein R2 is ⅔ or ½.

17. A computer program product comprising a non-transitory computer-readable medium storing computer executable instructions, that when executed by at least one processor, cause the at least one processor to:
obtain information bits;
determine a puncturing pattern, wherein the puncturing pattern comprises an element in a puncturing set and an element in a shortening set, and the puncturing set and the shortening set have no intersection set; and
perform, by using the determined puncturing pattern, rate matching on data obtained after the obtained information bits are encoded.

18. A computer program product comprising a non-transitory computer-readable medium storing computer executable instructions, that when executed by at least one processor, cause the at least one processor to:
obtain information bits;
determine a frozen set, wherein the frozen set comprises a first frozen subset, a second frozen subset, and a third frozen subset, third frozen subset is determined based on the first frozen subset and the second frozen subset, and the third frozen subset comprises elements with lowest reliability in an initial sequence other than elements in the first frozen subset and elements in the second frozen subset; and perform polar encoding on the obtained information bits by using the determined frozen set.

19. A computer program product, comprising computer executable instructions stored on a non-transitory computer-readable medium, wherein when the instructions are executed by at least one processor, the instructions cause the at least one processor to:

obtain information bits;

determine a puncturing pattern, wherein the puncturing pattern comprises an element in a puncturing set and an element in a shortening set, and the puncturing set and the shortening set have no intersection set; and perform, by using the determined puncturing pattern, rate matching on data obtained after the obtained information bits are encoded.

20. A computer program product, comprising computer executable instructions stored on a non-transitory computer-readable medium, wherein when the instructions are executed by at least one processor, the instructions cause the at least one processor to:

obtain information bits;

determine a frozen set, wherein the frozen set comprises a first frozen subset, a second frozen subset, and a third frozen subset, the third frozen subset is determined based on the first frozen subset and the second frozen subset, and the third frozen subset comprises elements with lowest reliability in an initial sequence other than elements in the first frozen subset and elements in the second frozen subset; and perform polar encoding on the obtained information bits by using the determined frozen set.

* * * * *